United States Patent
Kunoh et al.

(10) Patent No.: US 7,759,219 B2
(45) Date of Patent: Jul. 20, 2010

(54) METHOD OF MANUFACTURING NITRIDE SEMICONDUCTOR DEVICE

(75) Inventors: Yasumitsu Kunoh, Moriguchi (JP); Kunio Takeuchi, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 744 days.

(21) Appl. No.: 11/524,258

(22) Filed: Sep. 21, 2006

(65) Prior Publication Data

US 2007/0066037 A1    Mar. 22, 2007

(30) Foreign Application Priority Data

Sep. 22, 2005  (JP)  ............................ 2005-276854
Sep. 14, 2006  (JP)  ............................ 2006-249883

(51) Int. Cl.
*H01L 21/18* (2006.01)

(52) U.S. Cl. ............... 438/458; 438/22; 438/46; 438/47; 438/795; 438/796; 438/797; 257/E21.097; 257/E21.398

(58) Field of Classification Search ............ 438/29–31, 438/22, 46, 458, 795, 796, 797, 47; 257/E21.398, 257/E21.097
See application file for complete search history.

(56) References Cited

U.S. PATENT DOCUMENTS

| | | | |
|---|---|---|---|
| 5,851,905 A * | 12/1998 | McIntosh et al. | ............ 438/492 |
| 6,071,795 A | 6/2000 | Cheung et al. | |
| 6,303,405 B1 | 10/2001 | Yoshida et al. | |
| 7,189,588 B2 | 3/2007 | Usui et al. | |
| 2005/0040425 A1 | 2/2005 | Akita | |
| 2005/0059178 A1 | 3/2005 | Erchak et al. | |

FOREIGN PATENT DOCUMENTS

| | | |
|---|---|---|
| CN | 1581525 | 2/2005 |
| CN | 1666319 | 9/2005 |
| EP | 1505661 | 2/2005 |
| JP | 2000-101139 | 4/2000 |
| JP | 2002-338398 | 11/2002 |
| JP | 2004-072052 | 3/2004 |
| JP | 2005-93988 | 4/2005 |

OTHER PUBLICATIONS

Applied Physics Letter vol. 85, No. 11 1961-1963; Compositional dependence of phase separation in InGaN Layers; M. Rao, et al.
Journal of Crystal Growth 289 (2006) 107-112; Improvement of green LED by growing p-GaN on in 0.25GaN MQWs at low temperature; Min-Suk Oh, et al.
Chinese Search Report and Office Action for corresponding application, dated Sep. 4, 2009, English Translations included.
European Search Report from corresponding European case, dated Nov. 5, 2009.

* cited by examiner

*Primary Examiner*—Kiesha R Bryant
*Assistant Examiner*—Minchul Yang
(74) *Attorney, Agent, or Firm*—NDQ&M Watchstone LLP (57) ABSTRACT

A method of manufacturing a nitride semiconductor device includes the steps of; forming a stripping layer including In on a substrate; forming a nitride semiconductor layer on the stripping layer; causing a decomposition of the stripping layer by increasing a temperature of the stripping layer; irradiating the stripping layer with laser light; and separating the nitride semiconductor layer from the substrate.

18 Claims, 8 Drawing Sheets

METHOD OF MANUFACTURING NITRIDE SEMICONDUCTOR DEVICE

CROSS REFERENCE TO RELATED APPLICATIONS

This application is based upon and claims the benefit of priority from prior Japanese Patent Application No. 2005-276854, filed on Sep. 22, 2005; and prior Japanese Patent Application No. 2006-249883, filed on Sep. 14, 2006; the entire contents of which are incorporated herein by reference.

BACKGROUND OF THE INVENTION

1. Field of the Invention

The present invention relates to a method of manufacturing a nitride semiconductor device.

2. Description of the Related Art

In recent years, nitride semiconductor devices containing GaN, InN, AlN or the like, are heavily used as electronic device materials for blue and green light emitting diodes, light emitting devices such as blue-violet semiconductor lasers and high speed transistors operable at high temperatures.

A manufacturing method is suggested, where a growth substrate is replaced with a metal substrate having high heat dissipation property after forming a semiconductor device layer on the growth substrate.

For example, as one method, the method includes the steps of forming a nitride semiconductor layer on a sapphire substrate, decomposing neighbor of a boundary surface between the sapphire substrate and the nitride semiconductor layer, by irradiating laser light of ultraviolet region from reverse side of the sapphire substrate, and separating the nitride semiconductor layer from the sapphire substrate. (for example, Unexamined Japanese Application No. 2000-101139)

Moreover, as another method, the method includes the steps of forming a stripping layer having lower band-gap energy than a growth substrate on the growth substrate composed of the GaN, irradiating laser light having a energy higher than the band-gap energy of the stripping layer and lower than the band-gap energy of the growth substrate, after forming a nitride semiconductor layer on the stripping layer, and separating the nitride semiconductor layer from the growth substrate. (for example, Unexamined Japanese Application No. 2005-93988)

Here, in the method where the stripping layer is formed on the growth substrate, since the nitride semiconductor layer is formed on the stripping layer, a material of the stripping layer is necessarily same material of the nitride semiconductor layer. In this case, a composition of the stripping layer is necessarily to be formed of an alloy composition close to the nitride semiconductor layer, and the stripping layer is necessarily to be formed into thin film, for decreasing crack by strain for nitride semiconductor layer and defects such as threading dislocations. That is, since the composition of the stripping layer is close to the nitride semiconductor layer, the band-gap energy of the stripping layer approximates the band-gap energy of the nitride semiconductor layer and the growth substrate. Since, the stripping layer formed into thin film, the laser light easily penetrates through the stripping layer.

As described above, as the photon energy of the laser light is to be about the same as the band-gap energy of the nitride semiconductor layer, and amount of the laser light penetrating the stripping layer increases, the laser light could be absorbed in the nitride semiconductor layer (for example, an active layer formed in an light emitting device), corresponding to the composition of the nitride semiconductor layer and amount of the defects in grain. That is, characteristics of the nitride semiconductor device (optical characteristics and electrical characteristics) may be degrade by the absorption of the laser light causing damages to the nitride semiconductor layer.

Generally, metals (such as palladium, nickel and platinum), used for a material of a p-side ohmic electrode provided in the nitride semiconductor device, tend to easily absorb short wavelength light included in a visible light region. Therefore, when the photon energy of the laser light is to be about the same as the band-gap energy of the nitride semiconductor layer and a wavelength of the laser light irradiated to the stripping layer is relatively short, the laser light is easily absorbed in the electrode such as the p-side ohmic electrode. That is, the electrode easily generates heat and the electrical characteristics of the nitride semiconductor device may be degraded.

SUMMARY OF THE INVENTION

An aspect of a method of manufacturing a nitride semiconductor device includes the steps of; forming a stripping layer including In on a substrate; forming a nitride semiconductor layer on the stripping layer; causing a decomposition of the stripping layer by increasing a temperature of the stripping layer; irradiating the stripping layer with laser light; and separating the nitride semiconductor layer from the substrate.

According to this aspect, since the decomposition of the stripping layer, which is considered as phase separation, is caused, absorption spectrum in the stripping layer changes between before and after the decomposition caused. Moreover, the change of absorption spectrum in the stripping layer is considered to be cased by segregation of metal Ga, metal In, and InN and generation of defects (namely, the decomposition).

Thereby, absorption coefficient of the stripping layer caused the decomposition is increased more than absorption coefficient of the nitride semiconductor layer and the substrate, and absorption edge of the stripping layer caused the decomposition is lengthened more than absorption edge of the nitride semiconductor layer and the substrate. That is, even if the composition of the stripping layer is close to the composition of the nitride semiconductor layer and the substrate, and the stripping layer is formed of thin film, it is possible to increase the absorption coefficient and lengthen the absorption edge of the stripping layer.

Therefore, as sufficiently minimizing the photon energy of the laser light irradiated to the stripping layer, compared to the band-gap energy of the nitride semiconductor layer and the substrate, the stripping layer absorbs the laser light. Accordingly, the nitride semiconductor can be easily separated from the substrate, and the degradation of the characteristics in the nitride semiconductor device caused by the laser light can be suppressed.

Moreover, even if the laser light irradiated to the stripping layer through the substrate, it is possible to suppress a generation of a crack and a decomposition of substrate caused from defects and impurity in the substrate. Also, even if the laser light reaches an electrode, affection of the laser light toward the electrode can be suppressed.

In the aspect described above, the stripping layer is formed of InGaN containing In with the In composition ratio equal to or more than 18%.

According to this aspect, since the stripping layer includes In equal to or more than 18%, the decomposition of the stripping layer can be caused easily.

In the aspect described above, photon energy of the laser light is preferably lower than the band-gap energy of the substrate.

According to this aspect, even if the laser is irradiated to the stripping layer through the substrate, the substrate hardly absorbs the laser light. Accordingly, affection of the laser light toward the substrate can be suppressed.

In the aspect described above, photon energy of the laser light is preferably lower than the band-gap energy of respective layers forming the nitride semiconductor layer.

According to this aspect, even if the laser irradiated to the stripping layer penetrates the stripping layer and reaches the nitride semiconductor layer, the nitride semiconductor layer hardly absorbs the laser light. Accordingly, affection of the laser light toward the substrate can be suppressed.

In the aspect described above, photon energy of the laser light is preferably higher than the band-gap energy of the stripping layer caused the decomposition.

DETAILED DESCRIPTION OF THE PREFERRED EMBODIMENTS

Hereinafter, embodiments of the present invention will be described with reference to the drawings. Incidentally, in the following descriptions on the drawings, the corresponding or like reference numerals denote corresponding or like elements. However, it should be noted that the drawings are schematic, and that some of measurement ratios and the like, are not to scale.

Consequently, specific measurements should be judged in consideration of the following descriptions. In addition, it goes without saying that the drawings include parts of which relation and ratio are different from one another.

Figure 1:
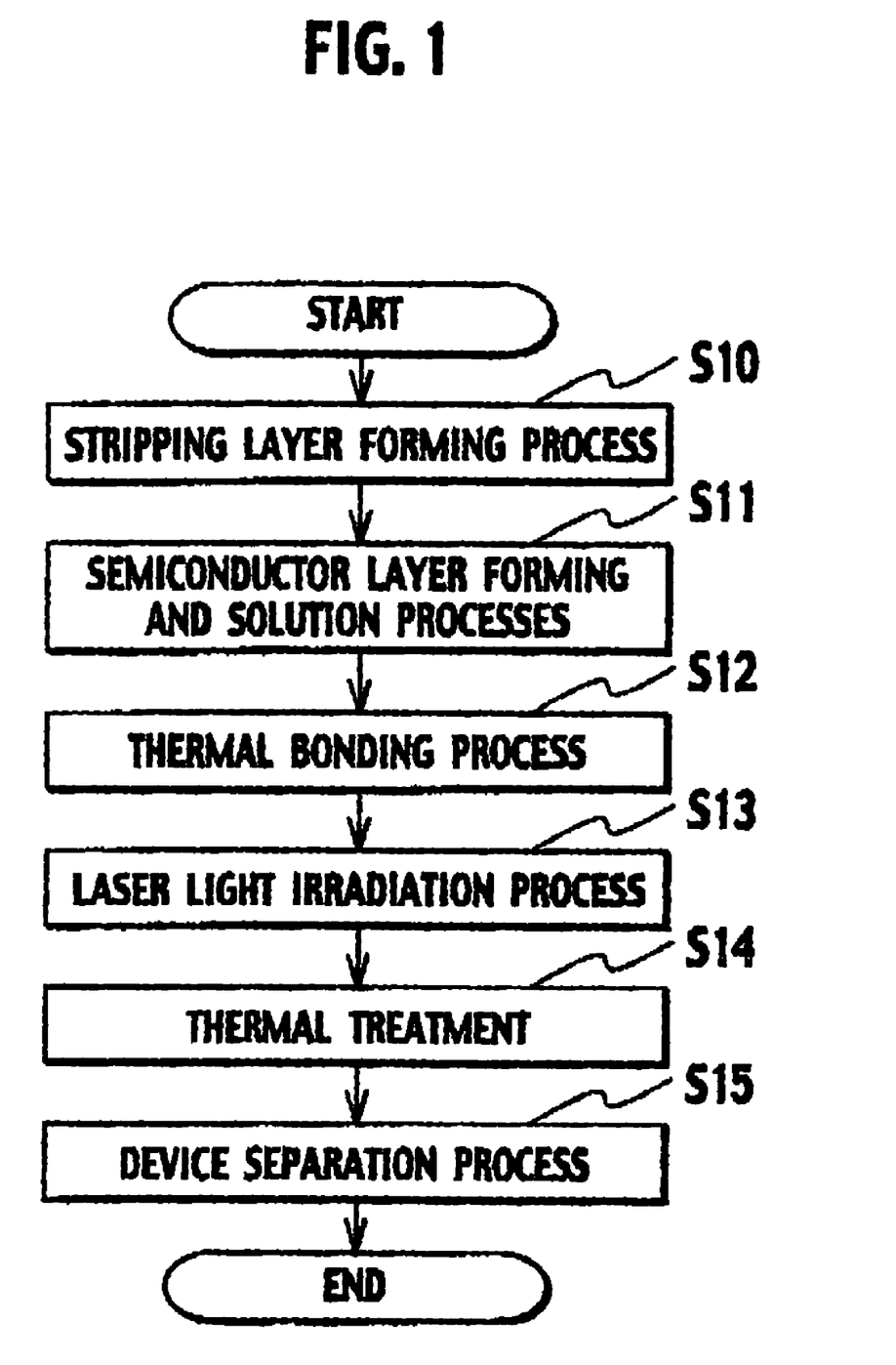
FIG. 1 shows a flow of a method of manufacturing a nitride semiconductor device according to a first embodiment of the present invention.

Method of Manufacturing a Nitride Semiconductor Device According to a First Embodiment Hereinafter, descriptions will be provided for a method of manufacturing a light-emitting diode according to a first embodiment of the present invention with reference to FIGS. 1 to 7. FIG. 1 is a flowchart of the method of manufacturing a light-emitting diode according to a first embodiment of the present invention.

FIGS. 2 to 7 are cross-sectional views of the light-emitting diode according to the first embodiment in the course of manufacturing thereof.

Figure 2:
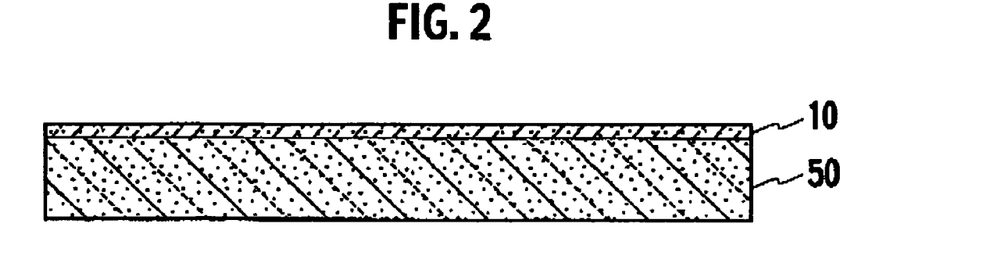
FIG. 2 shows the method of manufacturing the nitride semiconductor device according to the first embodiment of the present invention.

As shown in FIG. 1, a process of forming a stripping layer is performed in Step S10. At this point, as shown in FIG. 2, a stripping layer 10, which is formed of a nitride semiconductor containing In, is formed by use of an MOCVD (Metal Organic Chemical Vapor Deposition) method, on a growth substrate 50 formed of a GaN substrate.

Specifically, in a state where a growth substrate 50 is maintained at a growth temperature between about 700° C. and 1000° C. (for example, 770° C.), the stripping layer 10, which has a thickness of about 20 nm, and which is formed of undoped single crystal $Ga_{0.7}In_{0.3}N$, is formed on the growth substrate 50 by use of a source gas of $NH_3$, TMGa (trimethylgallium) and TMIn (trimethylindium).

In this event, it is preferable that the stripping layer 10 be formed of InGaN containing In with the In composition ratio of not less than 18%. Moreover, it is more preferable that the stripping layer 10 be formed of InGaN containing In with the In composition ratio of not more than 30%.

Figure 3A:
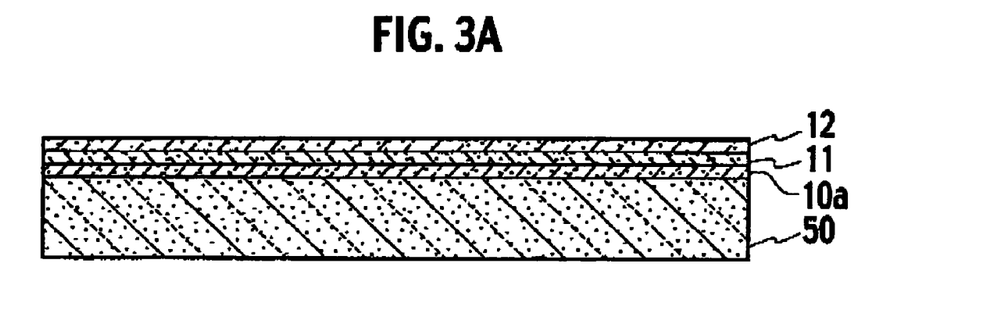
FIGS. 3A and 3B show the method of manufacturing the nitride semiconductor device according to the first embodiment of the present invention.
Figure 3B:
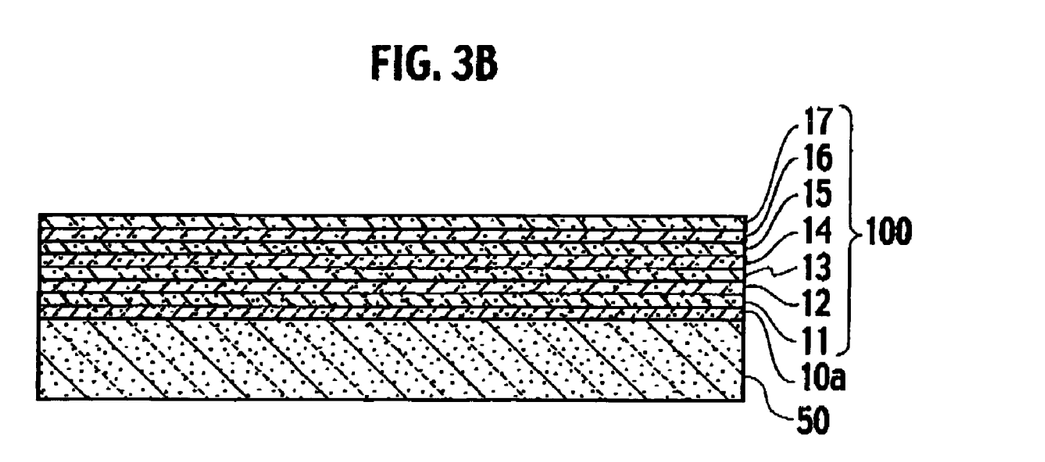

In Step S11, a process of forming a nitride semiconductor layer and a decomposition process for causing the decomposition of the stripping layer are performed. At this point, as shown in FIGS. 3A and 3B, the nitride semiconductor layer 100 is formed on the stripping layer 10 by use of the MOCVD method. Thereafter, the stripping layer 10 is caused the decomposition.

Here, the nitride semiconductor layer 100 is formed of an under layer 11, an n-type contact layer 12, an n-type cladding layer 13, an active layer 14, a p-type cap layer 15, a p-type cladding layer 16, and a p-type contact layer 17, which are formed from the side of the stripping layer 10 in the above order.

With reference to FIGS. 3A and 3B, the process of forming the nitride semiconductor layer and the decomposition process for causing the decomposition of the stripping layer will be further described. Note that, in FIG. 3A, the decomposition process is performed by causing indium nitride (InN), metal In and metal Ga in the stripping layer 10 to be segregated at the time when the under layer 11 is formed on the stripping layer 10 on the growth substrate 50.

Alternatively, in FIG. 3B, the decomposition process is performed after the nitride semiconductor layer 100 is formed.

First of all, as shown in FIG. 3A, in the process of forming the nitride semiconductor layer, the under layer 11, which has a thickness of about 1.0 μm, and which is formed of undoped single crystal GaN, is formed on the stripping layer 10 by use of source gas formed of $NH_3$ and TMGa in a state where the growth substrate 50 is maintained at a growth temperature between about 1000° C. and about 1200° C. (for example, 1150° C.). In FIG. 3A, a decomposition of the stripping layer 10, which is considered as phase separation, is caused and the stripping layer 10 is blackened, when the under layer 11 is formed on the stripping layer 10 on the growth substrate 50. The decomposition of the stripping layer 10 includes concept that the generation of defects (energy level caused by the defects) and segregation of metal Ga, metal In, and InN. The decomposition of the stripping layer 10 is considered as a factor of increasing absorption coefficient and lengthening a wavelength of an absorption edge.

Next, as shown in FIG. 3B, descriptions will be given for a case where the decomposition process for causing the decomposition of the stripping layer 10 is performed after the nitride semiconductor layer 100 is formed.

First, after the under layer 11 over the growth substrate 50 is formed, the n-type cladding layer 13 is formed on the n-type contact layer 12 by use of source gas, which is formed of $NH_3$, TMGa (trimethylgallium) and TMAl (trimethylaluminum), and dopant gas, which is formed of $SiH_4$, in a state where the growth substrate 50 is maintained at a growth temperature between about 1000° C. and about 1200° C. (for example, 1150° C.). The n-type cladding layer 13 has a thickness of about 0.15 μm, and is formed of single crystal $Al_{0.1}Ga_{0.9}N$ doped with Si.

Next, in a state where the growth substrate 50 is maintained at a growth temperature between about 700° C. and about 1000° C. (for example, 850° C.), well layers and barrier layers are alternately formed on the n-type cladding layer 13 by use of source gas formed of $NH_3$, TMG and TMIn. Each of the well layers has a thickness of about 5 nm, and is formed of undoped single crystal $Ga_{0.9}In_{0.1}N$, and each of the barrier layers has a thickness of about 10 nm, and is formed of undoped single crystal GaN. With the above process, the active layer 14, which has an MQW (Multiple-Quantum Well) structure including three well layers, can be formed.

Subsequently, the p-type cap layer, which has a thickness of about 10 nm, and which is formed of single crystal $Al_{0.1}Ga_{0.9}N$ doped with Mg, is formed on the active layer 14 by adding source gas, which is formed of $NH_3$, TMGa and TMIn, and dopant gas which is formed of $CP_2Mg$.

Thereafter, in a state where the growth substrate 50 is maintained at a growth temperature between about 1000° C. and about 1200° C. (for example, 1150° C.), the p-type cladding layer 16, which has a thickness of about 0.1 μm, and which is formed of single crystal $Al_{0.1}Ga_{0.9}N$ doped with Mg, is formed on the p-type cap layer by use of source gas, which is formed of $NH_3$, TMGa and TMAl, and dopant gas formed of $CP_2Mg$.

After that, in a state where the growth substrate 50 is maintained at a growth temperature between about 700° C. and about 1000° C. (for example, 850° C.), the p-type contact layer 17, which has a thickness of about 5 nm, and which is formed of single crystal $Ga_{0.95}In_{0.05}N$ doped with Mg, is formed on the p-type cladding layer 16 by use of source gas, which is formed of $NH_3$, TMGa and TMIn, and dopant gas formed of $CP_2Mg$.

Finally, the p-type cap layer, the p-type cladding layer 16 and the p-type contact layer 17 are respectively made into p-type layers by a thermal treatment or an electron beam treatment given thereto.

Thus, the nitride semiconductor layer 100 is formed of the under layer 11, the n-type contact layer 12, the n-type cladding layer 13, the active layer 14, the p-type cap layer 15, the p-type cladding layer 16, and the p-type contact layer 17.

Next, a decomposition of the stripping layer 10, which is considered as phase separation, is caused and the stripping layer 10 is blackened, by maintaining the growth substrate 50 at a high temperature. As described above, the decomposition of the stripping layer 10 includes concept that the generation of defects (energy level caused by the defects) and segregation of metal Ga, metal In, and InN. The decomposition of the stripping layer 10 is considered as a factor of increasing absorption coefficient and lengthening a wavelength of an absorption edge.

Specifically, in the stripping layer 10 after the decomposition caused, it is considered that indium nitride (InN), metal In and metal Ga are segregated. For example, the band-gap energy of indium nitride (InN) is about 0.7 eV, and the band-gap energy of metal In and metal Ga are also low. Thus, the band-gap energy of the stripping layer 10 can be lowered. That is, the band-gap energy of the stripping layer 10 can be lowered without adjusting a composition ratio thereof for In and the like contained in the stripping layer 10. Moreover, in the stripping layer after the decomposition caused, it is considered that since the energy level caused by the defects is formed with the band-gap, photon can be absorbed through the same energy level. Accordingly, the absorption coefficient will be increased and the wavelength of the absorption edge will be lengthened. The decomposition process for causing the decomposition of the stripping layer 10 may be performed at any time, as long as the decomposition process is performed after the under layer 11 is formed at least on a surface of the stripping layer 10 when the decomposition process does not influence the formation of the nitride semiconductor layer 100. However, in a case where there is a possibility that characteristics of the nitride semiconductor layer 100 be changed due to the temperature for causing the decomposition of the stripping layer 10, it is preferable that the stripping layer 10 be caused the decomposition at the time when the under layer 11 is formed on the stripping layer 10 as shown in FIG. 3A. A temperature, at which InN in the stripping layer 10 is segregated, can be controlled by changing a content of In, a thickness of the stripping layer 10, a stack structure and the like in the stripping layer 10.

For example, in FIG. 3A, the decomposition process is performed by the segregation of indium nitride (InN), metal In and metal Ga and the generation of the defects in the stripping layer 10, when the under layer 11 is formed on the stripping layer 10 on the growth substrate 50.

Alternatively, as shown in FIG. 3B, the decomposition process for causing the decomposition of the stripping layer 10 may be performed after the nitride semiconductor layer 100 is formed. Otherwise, the decomposition process may be performed on the stripping layer 10 while the nitride semiconductor layer 100 is being formed.

Figure 4:
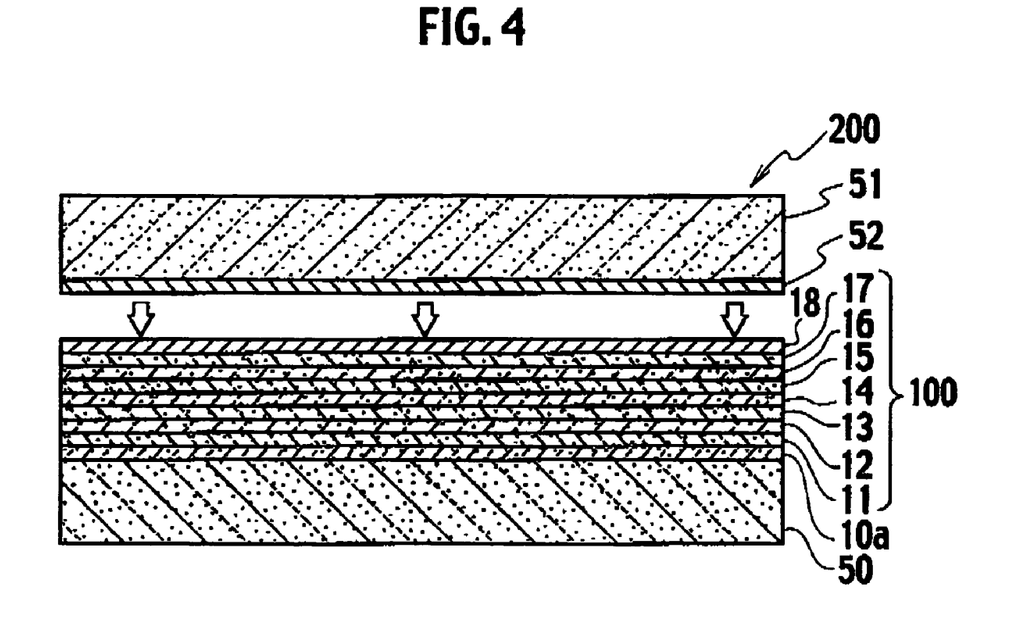
FIG. 4 shows the method of manufacturing the nitride semiconductor device according to the first embodiment of the present invention.

In Step S12, a thermal bonding process is preformed. At this point, as shown in FIG. 4, a p-type electrode 18 is formed on the p-type contact layer 17. Thereafter, a supporting substrate 51 including a bonding layer 52 is thermally bonded.

Here, the p-type electrode 18 is configured of three layers of Ag, Pt, Au layers which respectively have thicknesses of about 200 nm, about 200 nm, and about 500 nm, and which are formed from the side of the p-type contact layer 17 in the above order. The three layers are formed on the p-type contact layer 17 respectively by a vacuum evaporation method.

Accordingly, a nitride semiconductor device 200 is formed by forming the p-type electrode 18 on the nitride semiconductor layer 100.

On the other hand, the supporting substrate 51 is formed of Si, and has a thickness of about 200 μm. The bonding layer 52 formed on the supporting substrate 51 is constituted of three layers of Ti, Pd and Au layers, which respectively have thicknesses of about 10 nm, about 50 and about 500 nm, and which are formed from the side of the supporting substrate 51 in the above order. The three layers are formed respectively by the vacuum evaporation method.

Next, the Au layer of the p-type electrode 18 and that of the bonding layer 52 are thermally bonded to each other by use of solder formed of Au—Sn, Pd—Sn, In—Sn or the like, or by use of conductive paste formed of Ag. For example, in a case of joining the above Au layers to each other with solder formed of Au—Sn (in a composition ratio of 80% Au to 20% Sn), the growth substrate 50 and the supporting substrate 51 are heated to about 300° C., and are maintained under pressure of about 0.3 Pa for several dozens of minutes. Thereby, the two Au layers are thermally bonded to each other.

Figure 5:
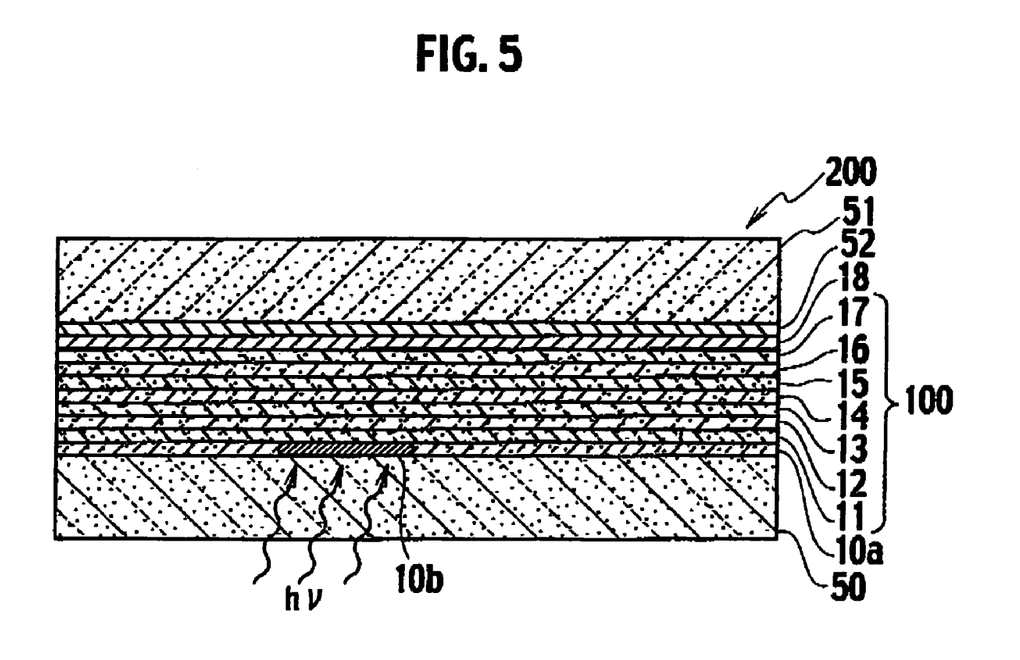
FIG. 5 shows the method of manufacturing the nitride semiconductor device according to the first embodiment of the present invention.

In Step S13, a laser irradiating process is performed. At this point, as shown in FIG. 5, by irradiating the stripping layer 10 blackened by the decomposition with the laser light, the stripping layer 10 is decomposed into In, Ga and $N_2$ to be a separation layer 10b.

Specifically, the stripping layer 10 is first irradiated from the side of the growth substrate 50 with a second harmonic having 2.3 eV of the photon energy. Such a second harmonic includes Nd:YAG (Neodymium:Yttrium-Aluminium-Garnet) laser light and Nd:YVO$_4$ laser light. The irradiation is performed with an energy density of the laser light between about 200 mJ/cm$^{-2}$ and about 1000 mJ/cm$^{-2}$, and the laser light is absorbed into the stripping layer 10. Thereby, a part of the under layer 11 and the stripping layer 10 are decomposed into In, Ga and $N_2$ to be a separation layer 10b.

It is preferable that the photon energy of the laser light be lower than the band-gap energy of the nitride semiconductor layer 100.

Figure 6:
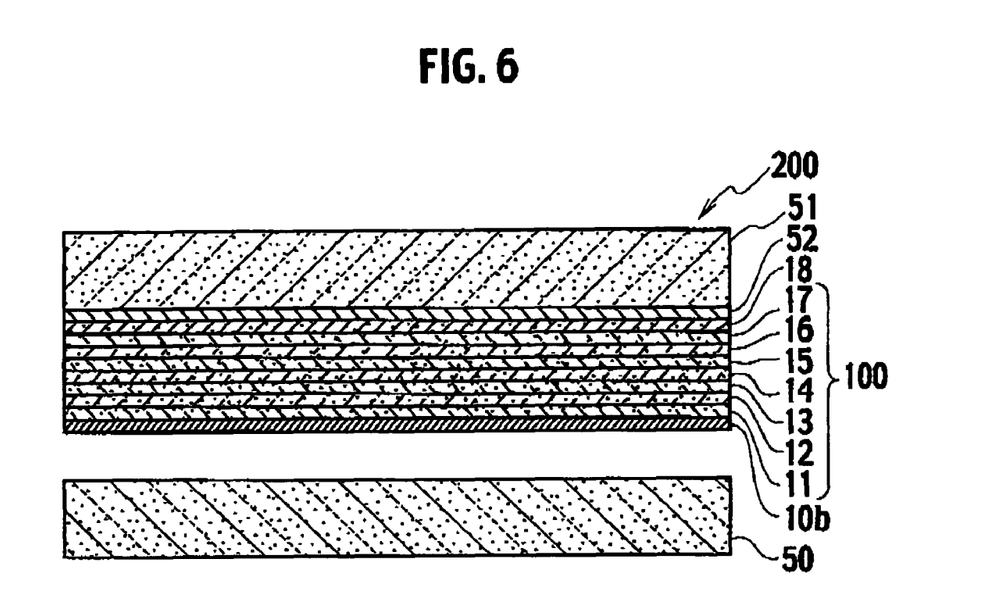
FIG. 6 shows the method of manufacturing the nitride semiconductor device according to the first embodiment of the present invention.

Subsequently, the thermal treatment is performed in Step S14. At this point, as shown in FIG. 6, the growth substrate 50 is separated from the nitride semiconductor device 200 by heating the nitride semiconductor device 200. Specifically, the growth substrate 50 is separated from the nitride semiconductor device 200 by heating the nitride semiconductor device 200 to about 200° C., and thereby causing In and Ga of the separating layer 10b to be in a molten state.

Thereafter, by polishing or etching the nitride semiconductor layer 100 which is exposed as a result of the separation of the growth substrate 50, the separation layer 10b and the under layer 11 are removed for the n-type contact layer 12 to be exposed.

Figure 7:
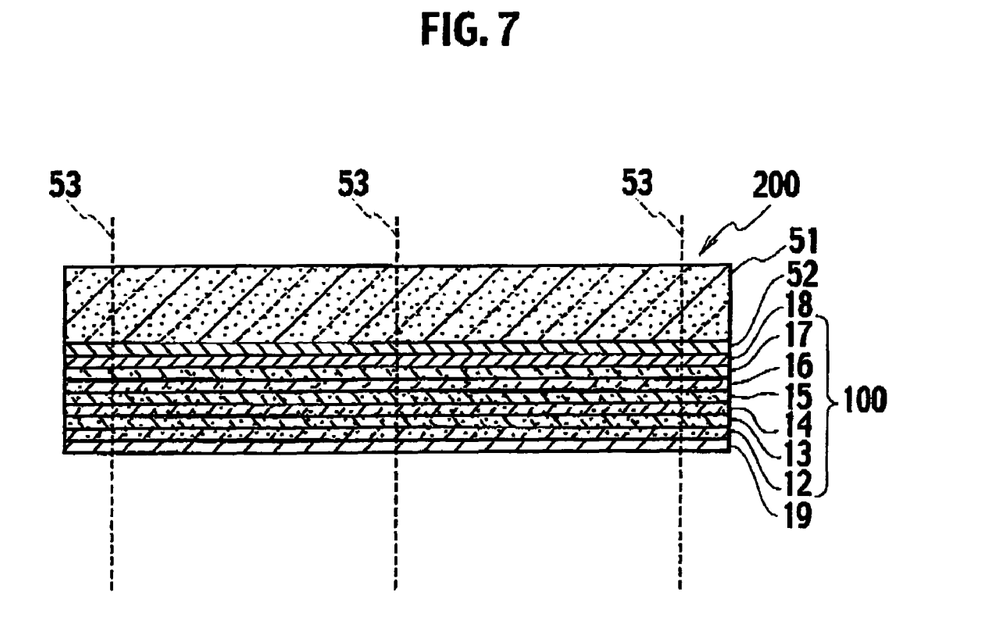
FIG. 7 shows the method of manufacturing the nitride semiconductor device according to the first embodiment of the present invention.

In Step S15, a process of splitting the device is performed. At this point, as shown in FIG. 7, an n-type electrode 19 is formed on the n-type contact layer 12 of the nitride semiconductor layer 100. Thereafter, the nitride semiconductor device 200 is split. Specifically, the translucent n-type electrode 19 is formed on the n-type contact layer 12 by use of the vacuum evaporation method. The n-type electrode 19 is formed of a Ti layer having a thickness of about 1 nm and an Al layer having a thickness of about 5 nm.

After that, device separation is performed by dividing the nitride semiconductor device 200 by dicing with laser scribing, or with selective etching, on the supporting substrate 51 along separation lines 53 perpendicular to a plane of the supporting substrate 51 on which the nitride semiconductor layer 100 is grown. Thereby, the light-emitting diode of the first embodiment according to the present invention can be obtained.

Functions and Effects of the Method of Manufacturing the Nitride Semiconductor Device According to the First Embodiment According to the method of manufacturing the light-emitting diode of the first embodiment according to the present invention, the stripping layer 10 is formed on the growth substrate 50, and the temperature thereof is increased. Thereby, the band-gap energy of the stripping layer 10 can be lowered without adjusting a composition ratio of the stripping layer 10.

Accordingly, a difference between the band-gap energy of the stripping layer 10 and the band-gap energy of the growth layer 50 is greater. Thus, the photon energy of the laser light can be made sufficiently lower than the band-gap energy of the growth substrate 50 even when the photon energy of the laser light is made larger than the band-gap energy of the stripping layer 10.

Thereby, influence exerted upon the growth substrate 50 by the photon energy of the laser light is smaller, and the nitride semiconductor layer 100 can be separated easily from the growth substrate 50 while reducing decomposition and cracking of the growth substrate 50 and degradation in characteristics of the nitride semiconductor devices 200, which stem from a defect, an impurity or the like in the growth substrate 50.

Moreover, because decomposition and cracking of the growth substrate 50 can be reduced, it is made possible to reuse the growth substrate 50.

Additionally, in a case where the laser light permeates the stripping layer 10 to reach the nitride semiconductor layer 100, degradation in characteristics of the nitride semiconductor devices 200 can be reduced due to the low photon energy of the laser light.

Moreover, because a difference between the band-gap energy of the growth layer 50 and the band-gap energy of the stripping layer 10 is greater, a usable range of the photon energy of the laser light is wider.

In addition, by forming the stripping layer 10 of InGaN containing In with the In composition ratio of not less than 18%, the stripping layer 10 can be caused the decomposition easily. Thereby, the laser light is more likely to be absorbed into the stripping layer 10 after the decomposition caused. Hence, the band-gap energy of the stripping layer can be lowered.

Furthermore, by forming the stripping layer 10 of InGaN containing In with the In composition ratio of not more than 30%, the nitride semiconductor layer 100 can be formed easily on the stripping layer 10.

When the laser light, with which the stripping layer 10 is irradiated through the growth substrate 50, permeates the stripping layer 10 to cause the nitride semiconductor layer 100 to be irradiated, the photon energy of the laser light is lower than the band-gap energy of each of layers forming the nitride semiconductor layer 100. Thereby, it is more difficult for the laser light to be absorbed into the respective layers forming the nitride semiconductor layer 100. Thus, it is made possible to reduce damage, which the laser light exerts on the nitride semiconductor layer 100.

Additionally, the photon energy of the laser light is not less than 0.8 eV. Thus, the photon energy of the laser light is even higher than the band-gap energy of the stripping layer 10 after the decomposition caused formed of the nitride semiconductor containing In. Thereby, the laser light is sufficiently absorbed into the stripping layer 10 after the decomposition caused, and decomposes the stripping layer 10 more. It is therefore easier to separate the growth substrate 50 and the nitride semiconductor layer 100 from each other.

Moreover, because the photon energy of the laser light is not less than 2.7 eV, damage to the growth substrate 50 can be reduced. Thereby, it is made possible to reuse the growth substrate 50.

Method of Manufacturing a Nitride Semiconductor Device According to a Second Embodiment Hereinafter steps of a method of manufacturing a nitride semiconductor laser according to a second embodiment of the present invention will be further described respectively with reference to FIG. 1, and FIGS. 8 to 13.

Incidentally, differences between the second embodiment and the aforementioned first embodiment will be mainly described below.

Specifically, in the first embodiment, the nitride semiconductor layer 100 is configured of the under layer 11, the n-type contact layer 12, the n-type cladding layer 13, the active layer 14, the p-type cap layer 15, the p-type cladding layer 16, and the p-type contact layer 17.

On the other hand, in the second embodiment, a nitride semiconductor layer 101 is configured of an under layer 21, an n-type contact layer 22, an n-type cladding layer 23, an n-type optical guiding layer 30, an active layer 24, a p-type cap layer 25, a p-type optical guiding layer 31, a p-type cladding layer 26, and a p-type contact layer 27. Thereafter, ridge portions 64, a current blocking layer 32, a p-side ohmic electrode 33 and a p-side pad electrode 34 are additionally formed thereon. That is, the second embodiment is different in that layers constituting the nitride semiconductor layer 101 include the n-type optical guiding layer 30 and the p-type optical guiding layer 31, and in that the ridge portions 64, the current blocking layer 32, the p-side ohmic electrode 33 and the p-side pad electrode 34 are formed thereon.

FIGS. 8 to 13 are cross-sectional views of the nitride semiconductor laser according to the second embodiment in the course of manufacturing thereof.

Figure 8:
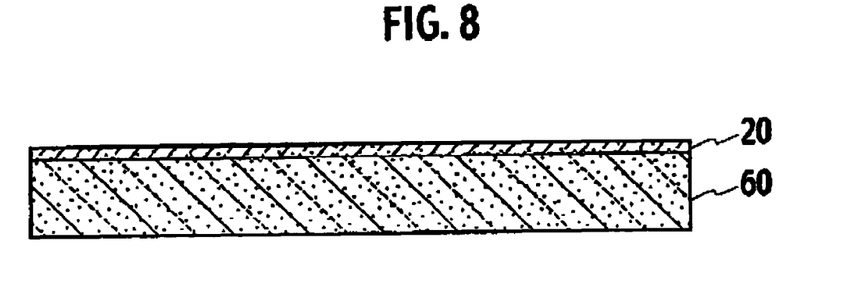
FIG. 8 shows a method of manufacturing a nitride semiconductor device according to a second embodiment of the present invention.

In Step S10, a process of forming a stripping layer is performed. As shown in FIG. 8, by use of the MOCVD method, a stripping layer 20, which is formed of a nitride semiconductor containing In, is formed on a growth substrate 60 formed of a GaN substrate as in the case with the first embodiment.

Figure 9A:
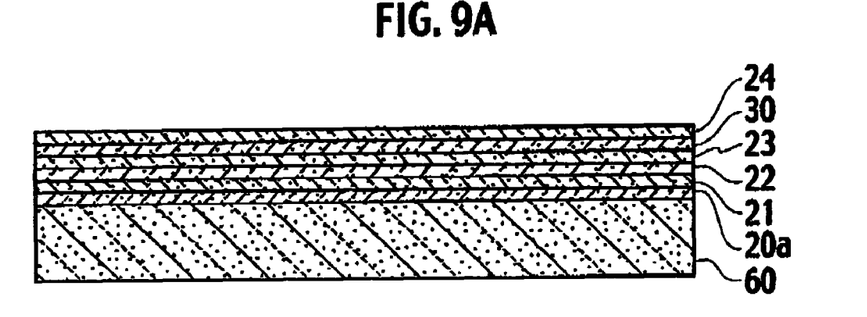
FIGS. 9A and 9B show the method of manufacturing the nitride semiconductor device according to the second embodiment of the present invention.
Figure 9B:
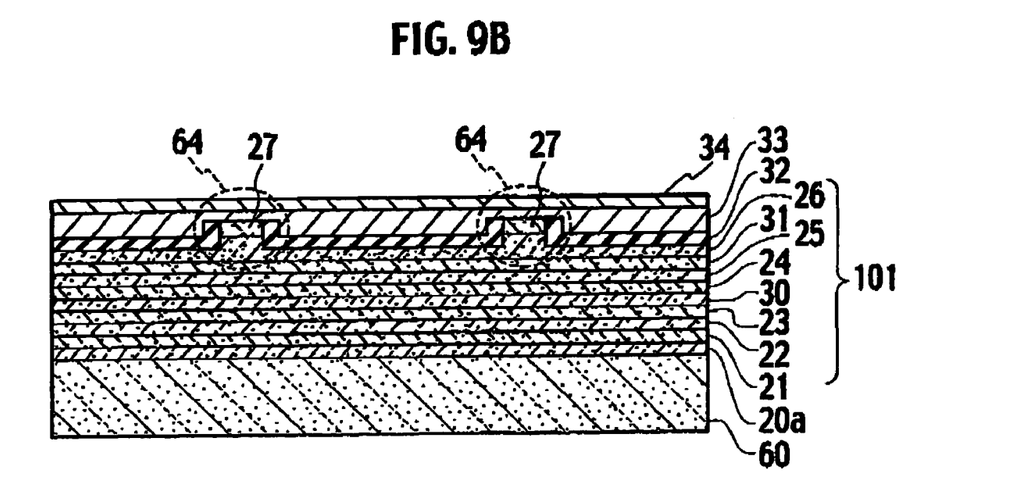

In Step S11, as in the case with the first embodiment, a process of forming a semiconductor layer and a decomposition process for causing the decomposition of the stripping layer are performed. At this point, as shown in FIGS. 9A and 9B, the nitride semiconductor layer 101 is formed on the stripping layer 20 by use of the MOCVD method as in the case with the first embodiment. Thereafter, the decomposition process for causing the decomposition of the stripping layer 20 is performed. The nitride semiconductor layer 101 is formed of the under layer 21, the n-type contact layer 22, the n-type cladding layer 23, the n-type optical guiding layer 30, the active layer 24, the p-type cap layer 25, the p-type optical guiding layer 31, the p-type cladding layer 26, and the p-type contact layer 27 which are formed from the side of the stripping layer 20 in the above order.

The decomposition process is performed, as shown in FIG. 9A, after the under layer 21 is formed on the stripping layer 20 as in the case with the first embodiment.

Alternatively, the decomposition process may be performed after, or during, the formation of the nitride semiconductor layer 101, as shown in FIG. 9B.

The method of forming the nitride semiconductor layer 101 will be specifically described. After the under layer 21 over the growth substrate 60 is formed, the n-type cladding layer 23 is formed on the n-type contact layer 22 by use of source gas, which is formed of $NH_3$, TMGa and TMAl, and dopant gas, which is formed of $SiH_4$, in a state where the growth substrate 60 is maintained at a growth temperature between about 1000° C. and about 1200° C. (for example, 1150° C.). The n-type cladding layer 23 has a thickness of about 1 μm, and is formed of single crystal $Al_{0.07}Ga_{0.93}N$ doped with Si.

Subsequently, in a state where the growth substrate 60 is maintained at a growth temperature between about 1000° C. and about 1200° C. (for example, 1150° C.), the n-type optical guiding layer 30 is grown on the n-type cladding layer 23 by use of source gas, which is formed of $NH_3$ and TMG, and dopant gas formed of $SiH_4$. The n-type optical guiding layer 30 has a thickness of about 0.1 μm, and is formed of single crystal GaN doped with Si.

Thereafter, in a state where the growth substrate 60 is maintained at a growth temperature between about 700° C. and about 1000° C. (for example, 850° C.), well layers and barrier layers are alternately formed on the n-type optical guiding layer 30 by use of source gas formed of $NH_3$, TMG and TMIn. Each of the well layers has a thickness of about 3.5 nm, and is formed of undoped single crystal $Ga_{0.85}In_{0.15}N$. Each of the barrier layers has a thickness of about 20 nm, and is formed of undoped single crystal $Ga_{0.95}In_{0.05}N$. Thereby, the active layer 24 of an MQW structure including three well layers is formed.

After that, the p-type cap layer 24, which has a thickness of about 20 nm, and which is formed of single crystal $Al_{0.25}Ga_{0.75}N$ doped with Mg, is formed on the active layer 24 by use of source gas formed of $NH_3$, TMGa and TMIn.

Subsequently, in a state where the growth substrate 60 is maintained at a growth temperature between about 1000° C. and about 1200° C. (for example, 1150° C.), the p-type optical guiding layer 31 is formed on the p-type cap layer 25 by use of source gas, which is formed of $NH_3$ and TMGa, and dopant gas formed of $CP_2Mg$. The p-type optical guiding layer 31 has a thickness of about 0.1 μm, and is formed of single crystal GaN doped with Si.

Thereafter, in a state where the growth substrate 60 is maintained at a growth temperature between about 1000° C. and about 1200° C. (for example, 1150° C.), the p-type cladding layer 26 is formed on the p-type cap layer 25 by use of source gas, which is formed of $NH_3$, TMGa and TMAl, and dopant gas formed of $CP_2Mg$. The p-type cladding layer 26 has a thickness of about 0.5 μm, and is formed of single crystal $Al_{0.07}Ga_{0.93}N$ doped with Mg.

Next, in a state where the growth substrate 60 is maintained at a growth temperature between about 700° C. and about 1000° C. (for example, 850° C.), the p-type contact layer 27 is formed on the p-type cladding layer 26 by use of source gas, which is formed of $NH_3$, TMGa and TMIn, and dopant gas which is formed of $CP_2Mg$. The p-type contact layer 27 has a thickness of about 3 nm, and is formed of single crystal $Ga_{0.99}In_{0.01}N$ doped with Mg.

Subsequently, the p-type cap layer 25, the p-type optical guiding layer 31, the p-type clad later 26, and the p-type contact layer 27 are respectively made into p-type layers by a thermal treatment or an electron beam treatment given thereto as in the case with the first embodiment.

Accordingly, the nitride semiconductor layer 101 is formed of the under layer 21, the n-type contact layer 22, the n-type cladding layer 33, the n-type optical guiding layer 30, the active layer 24, the p-type cap layer 25, the p-type optical guiding layer 31, the p-type cladding layer 26, and the p-type contact layer 27.

Next, the ridge portions 64 are formed by respectively removing predetermined regions of the p-type cladding layer 26 and of the p-type contact layer 27. Specifically, a fine pattern of stripes, each of which has a width of about 1.5 μm, and each of which extends in a [1-100] direction, is formed by use of a photolithography technique. Thereafter, the predetermined regions of the p-type cladding layer 26 and of the p-type contact layer 27 are removed by reactive ion etching with a chlorine-based gas. Thereby, the ridge portions 64 each having a width of about 1.5 μm are formed. On this occasion, a depth of the reactive ion etching is controlled in order that a thickness of a plane portion of the p-type cladding layer 26 excluding the ridge portions 64 thereof is about 0.05 μm.

Next, the current blocking layer 32 is formed on the p-type cladding layer 26. Specifically, by use of a plasma CVD method, a $SiO_2$ film is formed so as to cover a plane exposing the p-type cladding layer 26 and p-type contact layer 27. The $SiO_2$ film is provided with the ridge portions 64 of the nitride semiconductor layer 100, and has a thickness of about 0.2 μm. As in the case with the formation of the ridge portions 64, the current blocking layer 32 is formed by removing the $SiO_2$ film above an upper plane of the p-type contact layer 27 in convex portions of the ridge portions 64 by a photolithography technique, and by reactive ion etching with a $CF_4$ gas.

Subsequently, the p-side ohmic electrode 33 is formed on the current blocking layer 32 and on the p-type contact layer 27. Specifically, as in the case with the formation of the current blocking layer 32, the p-side ohmic electrode 33, which is formed of a Pt layer, a Pd layer, an Au layer and a Ni layer, is formed in stripes by the vacuum evaporation method. The Pt layer has a thickness of about 1 nm on the p-type contact layer 27 from an upper side of the p-type contact layer 27, the Pd layer has a thickness of about 100 nm, the Au layer has a thickness of about 240 nm, and the Ni layer has a thickness of about 240 nm.

Thereafter, the p-side pad electrode 34 is formed so as to cover a portion above the current blocking layer 32 as well as the p-side ohmic electrode 33. Specifically, the p-side pad electrode 34, which is formed of a Ti layer, a Pt layer, an Au layer, is formed. The above layers of Ti, Pt, and Au respectively have the thicknesses of about 100 nm, about 150 nm and about 3 μm, and are formed from the side of the current blocking layer 32 in the above order. By forming the nitride semiconductor layer 100, the current blocking layer 32, the p-side ohmic electrode 33 and p-side pad electrode 34, a nitride semiconductor device 201 is obtained.

Figure 10:
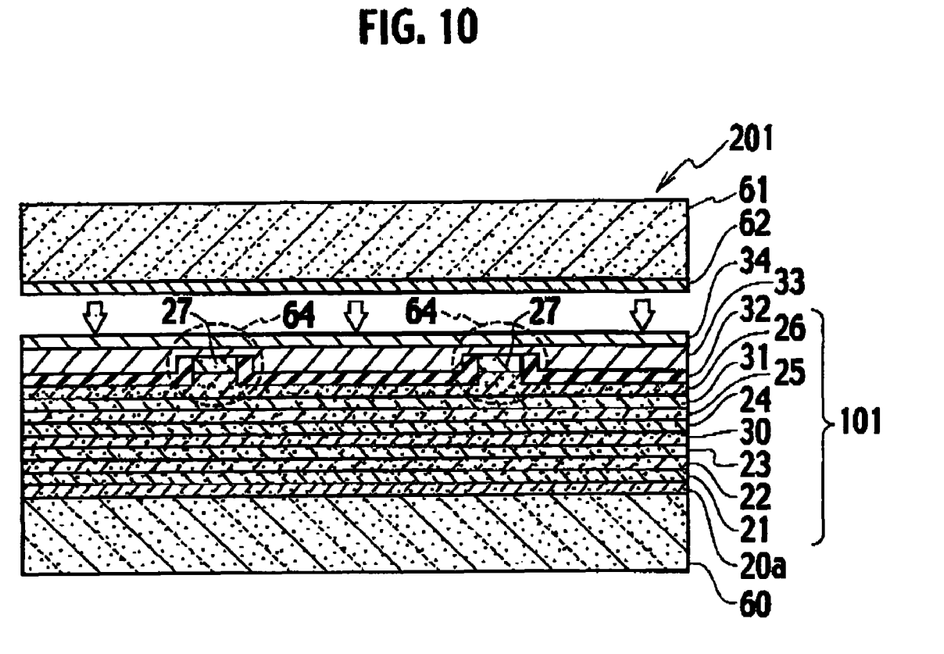
FIG. 10 shows the method of manufacturing the nitride semiconductor device according to the second embodiment of the present invention.

In Step S12, a thermal bonding process is preformed. At this point, as shown in FIG. 10, a supporting substrate 61 including a bonding layer 62 is thermally bonded onto the nitride semiconductor devices 201 as in the case with the first embodiment.

Figure 11:
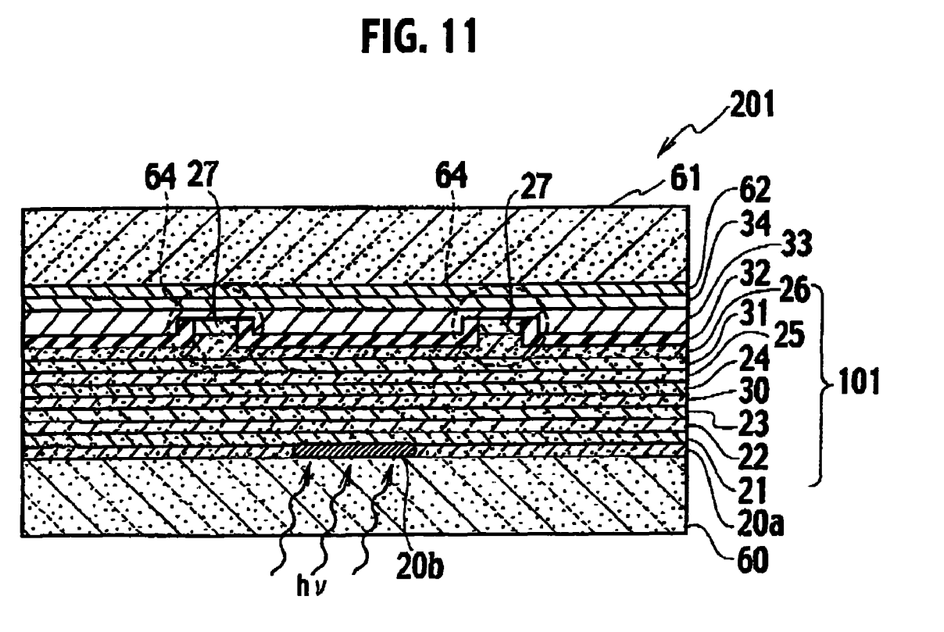
FIG. 11 shows the method of manufacturing the nitride semiconductor device according to the second embodiment of the present invention.

In Step S13, a laser irradiating process is performed. At this point, as shown in FIG. 11, by irradiating the stripping layer 20 blackened by the decomposition with the laser light as in the case with the first embodiment, the stripping layer 20 is decomposed into In, Ga and $N_2$ to be a separation layer 20b.

Figure 12:
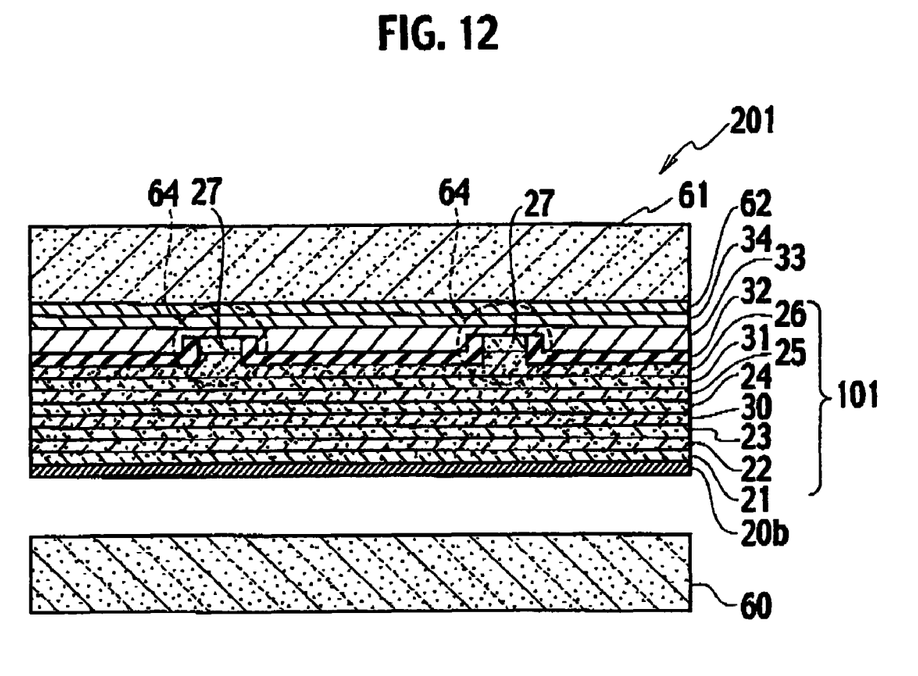
FIG. 12 shows the method of manufacturing the nitride semiconductor device according to the second embodiment of the present invention.

A thermal treatment is performed in Step S14. As shown in FIG. 12, the growth substrate 60 is separated from the nitride semiconductor device 201 by heating the nitride semiconductor devices 201 as in the case with the first embodiment.

Subsequently, by polishing or etching the nitride semiconductor layer 101 which is exposed as a result of the separation of the growth substrate 60, the separation layer 20b and the under layer 21 are removed for the n-type contact layer 22 to be exposed.

Figure 13:
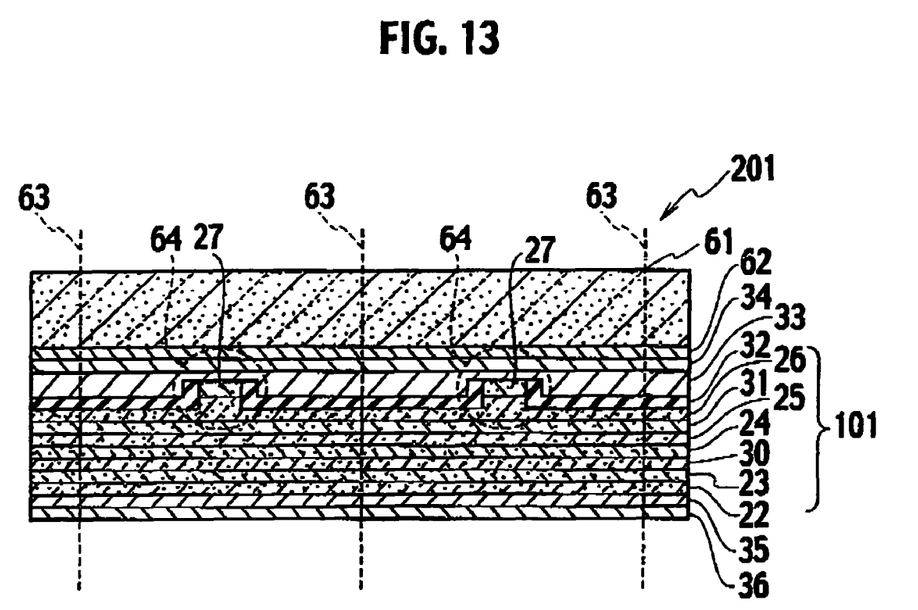
FIG. 13 shows the method of manufacturing the nitride semiconductor device according to the second embodiment of the present invention.

In Step S15, a process of splitting the device is performed. At this point, as shown in FIG. 13, an n-side ohmic electrode 35 is formed on predetermined regions on the n-type contact layer 22 of the nitride semiconductor layer 101. Specifically, the n-side ohmic electrode 35, which is formed of an Al layer, a Ni layer and an Au layer, is formed on the n-type contact layer 22 by use of the vacuum evaporation method. The above layers of Al, Ni and Au respectively have the thicknesses of about 6 nm, about 10 and about 700 nm.

Thereafter, an n-side pad electrode 36, which is formed of a Ni layer and an Au layer, is formed on the n-side ohmic electrode 35. The above layers of Ni and Au respectively have the thicknesses of about 10 and about 100 nm.

Subsequently, scribing is performed along separation lines perpendicular to the stripes of the ridge portions 64, and along separation lines 63 parallel to the stripes of the ridge portions 64. Thereby, device separation is performed while forming laser resonance planes, which are orthogonal to the respective stripes of the ridge portions 64, and which are each formed of a [1-1001] plane and a [-1100] plane. Thereby, the nitride semiconductor laser of the second embodiment according to the present invention can be obtained.

EXAMPLES

Figure 14:
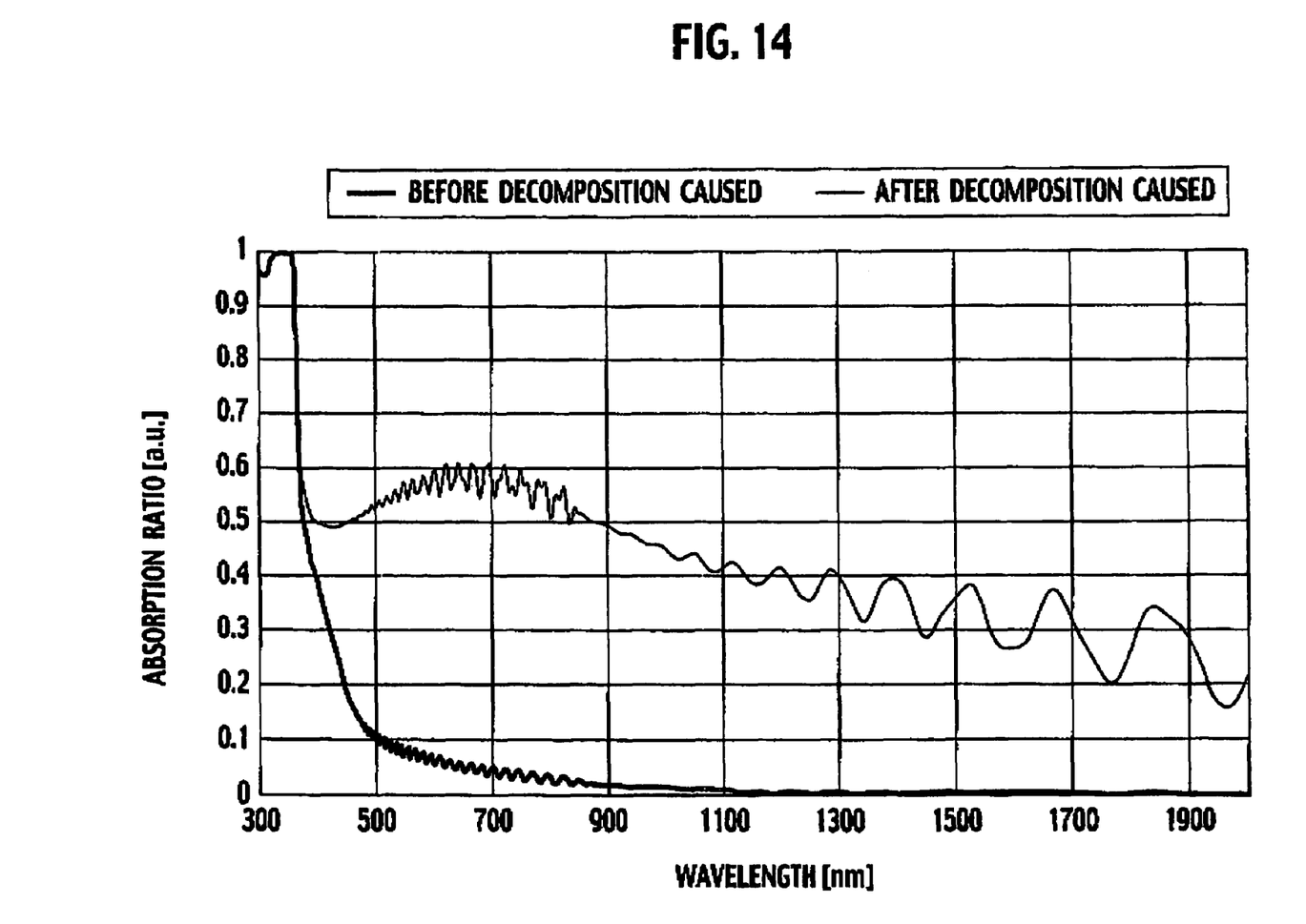
FIG. 14 shows a relationship between a wavelength and an absorption coefficient of laser light irradiated to a stripping layer.

Hereinafter, a comparison result of a relationship between a wavelength and an absorption ratio of the laser light irradiated to the stripping layer will be described, regarding the stripping layer before and after the decomposition caused. FIG. 14 shows the relationship between the wavelength and the absorption ratio of the stripping layer before and after the decomposition caused. Note that, horizontal axis shows the wavelength of the light and vertical axis shows absorption ratio of the light, in the FIG. 14.

As shown in FIG. 14, regarding the stripping layer before the decomposition caused, the wavelength band where the stripping layer absorbs the laser light sufficiently is short wavelength side only. For example, regarding the stripping layer before the decomposition caused, only the laser light of 400 nm or shorter can be used, to obtain the absorption ratio of 0.4 or more.

On the contrary, regarding the stripping layer after the decomposition caused, the wavelength band where the stripping layer absorbs the laser light sufficiently is expanded to the long wavelength side compared to the stripping layer before the decomposition caused. For example, regarding the stripping layer after the decomposition caused, the absorption ratio of 0.4 or more can be obtained in the wavelength of 1100 nm or lower.

Other Embodiments

Although the present invention has been described with the aforementioned embodiments, it should not be understood that the descriptions and the drawings, which constitute a part of this disclosure, are intended to limit this invention. On the basis of this disclosure, various alternative embodiments, examples, and operational techniques are to be apparent to those skilled in the art.

For example, the methods of manufacturing a light-emitting diode and a semiconductor laser, each of which utilizes light emitted from an active layer of a nitride semiconductor layer, have been exemplified in the first and second embodiments. Meanwhile, the present invention is not limited to the above. The present invention can also be employed for a method of manufacturing light-emitting devices with which a fluorescent substance using light emitted from each of these light-emitting devices as excitation light are combined. Moreover, the present invention is also applicable in: an electronic device such as an HEMT (High Electron Mobility Transistor) including a nitride semiconductor layer; a SAW (Surface Acoustic Wave) device; and a light receiving element. Furthermore, the present invention is applicable to a multi-wavelength semiconductor laser by applying thereto a technique of replacing a growth substrate according to the present invention. Accordingly, it is made possible to increase a yield in intervals between light-emitting points within a plane of a wafer in the multi-wavelength semiconductor laser.

Moreover, in each of the first and second embodiments, the descriptions are provided for the case where the nitride semiconductor layer is grown by use of the MOCVD method. However, the present invention is not limited to the above. The nitride semiconductor layer may be grown by use of an HVPE method, a gas-source MBE method, or the like. Furthermore, a crystalline structure of each of the nitride semiconductor layers may be a wurtzite structure or a zinc-blende structure. Additionally, a plane orientation of growth for each of the layers is not limited to [0001], and may be [11-20] or [1-100].

In each of the first and second embodiments, a GaN substrate is used as the growth substrate for the nitride semiconductor layer. However, the present invention is not limited to the above. A substrate, on which the nitride semiconductor layer can be grown, such as a SiC, ZnO, LAO, spinel, sapphire, or $Al_xGa_{1-x}N$ ($0 \leq X \leq 1$) substrate, is usable.

A layer formed of InGaN is exemplified as the stripping layer in each of the first and second embodiments. However, the present invention is not limited to the above. InAlN or InGaAlN is also usable. With any one of these mixed crystals containing Al, not only causing the decomposition of the stripping layer is easier, but also lattice constant differences of the stripping layer with the growth substrate and the nitride semiconductor layer can be eased by appropriately setting a composition ratio of the stripping layer. In addition, the stripping layer may have a multilayered structure. For example, a superlattice structure may be formed therein by superposing a layer in a composition ratio relatively rich in In, and a layer which contains no In, or which is in a composition ratio relatively low in In. Thereby, it is made possible to reduce degradation in crystallinity of the nitride semiconductor layer and distortion of the nitride semiconductor layer which stem from insertion of the stripping layer. Moreover, insertion of a superlattice structure formed of, for example, AlGaN and GaN is still more effective in reducing distortion of the nitride semiconductor layer.

In each of the first and second embodiments, a method, which uses thermal decomposition by heating in a growing phase of the nitride semiconductor layer, is exemplified as a method of the decomposition. However, the present invention is not limited to the above. A method using heating after growth of the nitride semiconductor layer, a method using light irradiation, or a method using electron beam irradiation can be employed. This is because a temperature of the nitride semiconductor layers can be increased also by the laser light or by the electron beam.

In each of the first and second embodiments, the second harmonic of Nd:YAG (or, Nd:YVO$_4$ or the like) laser light is exemplified as the laser light used for separation of the substrate. However, the present invention is not limited to the above. A fundamental harmonic of the laser light is also usable, and it is possible to reduce degradation of the nitride semiconductor layer by using femto second pulse laser light which is a ultra-short pulse light using a Ti sapphire laser, the degradation resulting from distortion thereof associated with heat generation at the time of laser light irradiation. Moreover, as a laser irradiating the laser light to the stripping layer, ruby laser and a CO/CO$_2$ laser may be used.

Although the supporting substrate is not limited to that of Si, it is preferable that the supporting substrate be electrically conductive. For example, a conductive semiconductor (Si, SiC, GaAs, ZnO, or the like), a metal or a composite metal (Al, Fe—Ni, Cu—W, Cu—Mo, or the like), a composite material containing a metal and a metallic oxide (Cu—CuO) or the like can be used as the supporting substrate. Generally, a metal-based material is excellent in mechanical characteristics, is less breakable, and is therefore more suitable as the supporting substrate, as compared to a semiconductor material. Furthermore, it is more preferable to use a material having both high conductivity and high mechanical strength by combining a highly conductive metal such as Cu, Ag, Au or the like, and a metal or metallic oxide, such as W, Mo, Ni, CuO or the like.

As has been described above, it goes without saying that the present invention includes various embodiments which are not described herein. Accordingly, a technical scope of the present invention is defined only by invention specifications according to the scope of claims, the invention specifications being appropriate based on the above descriptions.

What is claimed is:

1. A method of manufacturing a nitride semiconductor device, comprising the steps of:
   forming a stripping layer on a substrate, wherein the stripping layer comprises InGaN having an In composition ratio equal to or more than 18 mol %;
   forming a nitride semiconductor layer on the stripping layer;
   decomposing the stripping layer by increasing a temperature of the stripping layer;
   irradiating the decomposed stripping layer with laser light; and
   separating the nitride semiconductor layer from the substrate wherein, the decomposed stripping layer reduces a band gap-energy of the stripping layer; and,
   a photon energy of the laser light is smaller than the band-gap energy of the stripping layer before decomposition and is larger than a band-gap energy of the stripping layer after decomposition.

2. The method of manufacturing the nitride semiconductor device according to claim 1, wherein a photon energy of the laser light is lower than the band-gap energy of the substrate.

3. The method of manufacturing the nitride semiconductor device according to claim 1, wherein a photon energy of the laser light is lower than the band-gap energy of respective layers forming the nitride semiconductor layer.

4. The method of manufacturing the nitride semiconductor device according to claim 1, wherein
   the step of forming the nitride semiconductor layer on the stripping layer comprises forming an active layer; and
   the step of forming the active layer is performed after decomposing the stripping layer.

5. The method of manufacturing the nitride semiconductor device according to claim 1, wherein the stripping layer includes InAlN or InGaAlN.

6. The method of manufacturing the nitride semiconductor device according to claim 1, wherein the stripping layer has an In composition ratio of less than or equal to 30 mol %.

7. The method of manufacturing the nitride semiconductor device according to claim 1, wherein the stripping layer comprises a superlattice structure formed by superposing a layer in a composition ratio relatively rich in In, and a layer which contains no In, or which is in a composition ratio relatively low in In.

8. The method of manufacturing the nitride semiconductor device according to claim 1, comprising a step of:
   forming a layer having a superlattice structure formed of AlGaN and GaN between the stripping layer and the nitride semiconductor layer.

9. The method of manufacturing the nitride semiconductor device according to claim 1, wherein the substrate separated from the nitride semiconductor layer is reused as the substrate on which the stripping layer is formed.

10. A method of manufacturing a nitride semiconductor device comprising the steps of:
   forming a stripping layer including In on a substrate;
   forming a nitride semiconductor layer on the stripping layer, wherein the stripping layer has an In composition ratio of equal to or more than 18 mol %;
   decreasing a band-gap of the stripping layer by increasing a temperature of the stripping layer;
   irradiating the decreased band-gap stripping layer with laser light;
   separating the semiconductor layer from the substrate, wherein a photon energy of the laser light is smaller than the band-gap energy of the stripping layer before decreasing the band-gap, and is larger than the a band-gap energy of the stripping layer after the band-gap energy is decreased.

11. The method of manufacturing the nitride semiconductor device of claim 10, wherein a photon energy of the laser light is lower than the band-gap energy of the substrate.

12. The method of manufacturing the nitride semiconductor device of claim 10, wherein a photon energy of the laser light is lower than the band-gap energy of respective layers forming the nitride semiconductor layer.

13. The method of manufacturing the nitride semiconductor device of claim 10, wherein the step of forming the nitride semiconductor layer on the stripping layer comprises a step of forming an active layer; and
   the step of forming the active layer is performed after decreasing the band-gap of the stripping layer.

14. The method of manufacturing the nitride semiconductor device of claim 10, wherein the stripping layer has an In composition ratio of less than or equal to 30%.

15. The method of manufacturing the nitride semiconductor device according to claim 10, wherein the stripping layer includes InAlN, or InGaAlN.

16. The method of manufacturing the nitride semiconductor device of claim 10, wherein the stripping layer has a superlattice structure formed by superposing a layer in a composition ratio relatively rich in In, and a layer which contains no In, or which is in a composition ratio relatively low in In.

17. The method of manufacturing the nitride layer semiconductor device according to claim 10, comprising a step of:
   forming a layer having a superlattice structure formed of AlGaN and GaN between the stripping layer and the nitride semiconductor layer.

18. The method of manufacturing the nitride semiconductor device according to claim 10, wherein the substrate separated from the nitride semiconductor layer is reused as the substrate on which the stripping layer is formed.

* * * * *